United States Patent
Kugler et al.

(10) Patent No.: US 7,482,620 B2
(45) Date of Patent: Jan. 27, 2009

(54) ELECTROCHEMICAL DEVICE

(75) Inventors: Thomas Kugler, Cambridge (GB);
Magnus Berggren, Vreta Kloster (SE);
Tommi Remonen, Nyköping (SE);
Anna Ingalill Malmström, Norrköping (SE); Björn Knuthammar, Linkoping (SE); Petronella Norberg, Linköping (SE)

(73) Assignee: Acreo AB, Kista (SE)

( * ) Notice: Subject to any disclaimer, the term of this patent is extended or adjusted under 35 U.S.C. 154(b) by 100 days.

(21) Appl. No.: 10/495,653

(22) PCT Filed: Nov. 29, 2002

(86) PCT No.: PCT/SE02/02211

§ 371 (c)(1),
(2), (4) Date: Aug. 18, 2004

(87) PCT Pub. No.: WO03/047009

PCT Pub. Date: Jun. 5, 2003

(65) Prior Publication Data

US 2004/0256644 A1    Dec. 23, 2004

(30) Foreign Application Priority Data

Nov. 30, 2001  (SE) ................... 0104026

(51) Int. Cl.
*H01L 51/00* (2006.01)

(52) U.S. Cl. .............. 257/40; 257/E51.029; 438/82; 438/99

(58) Field of Classification Search ............ 257/40, 257/E51.029; 438/82, 99
See application file for complete search history.

(56) References Cited

U.S. PATENT DOCUMENTS

| | | | |
|---|---|---|---|
| 4,996,574 A * | 2/1991 | Shirasaki | 257/66 |
| 6,723,394 B1 * | 4/2004 | Sirringhaus et al. | 428/1.1 |
| 6,777,529 B2 * | 8/2004 | Ong et al. | 528/373 |
| 7,012,306 B2 * | 3/2006 | Arngarth et al. | 257/355 |
| 2004/0217877 A1 * | 11/2004 | Kokonaski et al. | 340/815.4 |

FOREIGN PATENT DOCUMENTS

| | | |
|---|---|---|
| EP | 0 478 380 | 4/1992 |
| WO | WO 98/41853 | 9/1998 |

* cited by examiner

*Primary Examiner*—A. Sefer
*Assistant Examiner*—Eduardo A Rodela
(74) *Attorney, Agent, or Firm*—Harness, Dickey & Pierce, PLC

(57) ABSTRACT

An electrochemical device is provided, comprising a source contact connected to a first antenna pad, a drain contact connected to a second antenna pad, at least one gate electrode, an electrochemically active element arranged between, and in direct electrical contact with, the source and drain contacts, which electrochemically active element comprises a transistor channel and is of a material comprising an organic material having the ability of electrochemically altering its conductivity through change of redox state thereof, and a solidified electrolyte in direct electrical contact with the electrochemically active element and said at least one gate electrode and interposed between them in such a way that electron flow between the electrochemically active element and said gate electrode(s) is prevented. In the device, flow of electrons between source contact and drain contact is controllable by means of a voltage applied to the gate electrode(s).

41 Claims, 17 Drawing Sheets

ELECTROCHEMICAL DEVICE

FIELD OF THE INVENTION

The present invention relates to radio frequency identification tags, and in particular to a radio frequency identification tag that is modulated by an electrochemical device. In particular, the present invention relates to printable, electrostatic antennas together with printable electrochemical transistor devices, based on conducting organic and/or inorganic materials.

BACKGROUND OF THE INVENTION

Remotely read identification tags have a wide range of different applications and uses (see for example RFID HANDBOOK "Radio-Frequency Identification Fundamentals and Applications" by Klaus Finkenzeller, John Wiley & Sons Ltd, Baffins Lane, Chichester, West Sussex, P019 1UD, England, ISBN 0 471 98851 0). One of the technologies is the capacitively coupled identification system such as Motorola's BiStatix™ technology. In these systems the smart part of the tag is in a silicon based integrated circuit placed in proximity to the antenna unit (capacitive coupled antenna). This chip together with the capacitevely coupled antenna unit is used to transmit a signal, usually an identification code. The connection between the integrated circuit and the antenna plates (usually two) may be via a transistor inside the circuit. The signal from the integrated circuit is, via the transistor, used for modulating the antenna characteristics in such a fashion that the receiver can recognise the signal and detect an ID code.

Semi-conducting and conducting organic materials, both polymers and molecules, have successfully been included in a large range of electronic devices, e g electrochemical devices, for instance as dynamic colorants in smart windows and in polymer batteries. Reversible doping and de-doping involving mobile ions switches the material between different redox states.

Use has been made of semi-conducting polymers for the realisation of field effect transistor (FET) devices. The transistor channel of these devices comprises the semi-conducting polymer in question, and their function is based on changes in charge carrier characteristics in the semi-conducting polymer, caused by an externally applied electric field. In such transistors, the polymer is used as a traditional semiconductor, in that the electric field merely redistributes charges within the polymer material. One such transistor has been realised, which is adapted for miniaturisation and can be used for the production of integrated circuits consisting entirely of polymer material (PCT publication WO99/10939). A stack of sandwiched layers is described, with either a top-gate or a bottom-gate structure. A transistor device with a similar architecture, also using a polymer as semi-conducting material in the channel of the transistor, is described in the European patent application EP 1041653.

Another type of transistor device based on organic materials utilises electrochemical redox reactions in the organic material. These devices comprise an electrolyte and a conducting polymer that can be switched between an oxidised and a reduced state. One of these oxidation states then corresponds to low, preferably zero, conductivity in the material, whereas the other oxidation state corresponds to a high conductivity relative to the first state. Electrochemical transistor devices have been used as sensors, e g for detection of oxidant in a solution (see, for review, Baughman and Shacklette, Proceedings of the Sixth Europhysics Industrial Workshop (1990), p 47-61). Furthermore, a transistor of the electrochemical type is reported in Rani et al, J Solid State Electrochem (1998), vol 2, p 99-101. The gate electrode architecture in this prior art transistor is shown in FIG. 1 of this reference.

Problems with capacitively coupled identification devices in the prior art include that they are difficult and expensive (>0.50 USD) to manufacture. In particular, the chip part of the identification unit is limiting the capability to mass-produce the tags to lower prices. Furthermore, materials used in the chips of prior art devices suffer from a lack of environmental friendliness, processability and economic production possibilities. Consequently, there is a need for new and improved identification circuitry with a simplified antenna-logic connection.

SUMMARY OF THE INVENTION

One of the objects of the present invention is then to meet this demand, by developing the art of capacitively coupled identification devices with an active antenna logic connection, and by providing a device with handling, production, disposal and other characteristics superior to those of the prior art.

Another object of the present invention is to provide a capacitively coupled identification device with an active antenna logic connection, which can be deposited on a large range of different rigid or flexible substrates by conventional printing methods.

Yet another object of the present invention is to provide an environmentally safe, capacitively coupled identification device with an active antenna logic connection so that the disposal of the device, along with any support onto which it has been deposited, does not give rise to handling problems, and so that no safety restrictions have to be imposed on the use of the device.

Still another object of the present invention is to make possible new applications of conducting organic materials, using several different properties of such materials in combination.

A further object of the invention is to provide processes for the production of such devices, which processes utilise conventional printing methods or other deposition techniques that are well known, relatively inexpensive and easily scaled up.

The aforementioned objects are met by capacitively coupled identification devices with an active antenna logic connection, as defined in the independent claims. Specific embodiments of the invention are defined in the dependent claims. In addition, the present invention has other advantages and features apparent from the detailed description below.

Thus, a supported or self-supporting electrochemical transmitter device is provided, which comprises:
  (i) an electrochemical transistor member having
    a source contact,
    a drain contact,
    at least one gate electrode,
    an electrochemically active element arranged between, and in direct electrical contact with, the source and drain contacts, which electrochemically active element comprises a transistor channel and is of a material comprising an organic material having the ability of electrochemically altering its conductivity through change of redox state thereof, and
    a solidified electrolyte in direct electrical contact with the electrochemically active element and said at least one gate electrode and interposed between them in such a way that electron flow between the electrochemically active element and said gate electrode(s) is prevented, whereby flow of electrons between source contact and drain contact is controllable by means of a voltage applied to said gate electrode(s); and (ii) an antenna member having a first antenna pad and a second antenna pad, wherein the source of the transistor member is in direct electrical contact with the first antenna pad and the drain of the transistor member is in direct electrical contact with the second antenna pad, such that the voltage applied to the gate electrode(s) can control the flow of electrons between the first and the second pad of the antenna member and thereby alter the frequency response of the transmitter device.

The architecture of the transmitter device according to the invention is advantageous in that it makes possible the realisation of a layered transmitter device with only a few layers, having for example one patterned layer of material comprising a conducting organic material, which layer comprises antenna pad(s), source and drain contacts and gate electrode(s), as well as the electrochemically active element. The antenna pad(s), source and drain contacts and the electrochemically active element are then preferably formed by one continuous piece of said material. The antenna pad(s), source and drain contacts could alternatively be formed from another electrically conducting material, such as a silver- or coal-based material, in direct electrical contact with the electrochemically active element. The gate electrode (s) may also be of another electrically conducting material. To provide for the necessary electrochemical reactions, whereby the conductivity in the active element is changed and hence the electrical connection (resistance) between the antenna pads is modulated, a solidified electrolyte is arranged so that it is in direct electrical contact with both the active element and the gate electrode(s).

It is to be understood, that the term transmitter device includes for example transponders and RF-ID (Radio Frequency Identification) tags.

In a preferred embodiment, the antenna pad(s), source and drain contacts and gate electrode(s), as well as the active element, are all arranged to lie in a common plane, further simplifying production of the device by ordinary printing methods. Thus, the transmitter device according to this embodiment of the invention uses a lateral device architecture. A layer of solidified electrolyte can advantageously be deposited so that it covers, at least partly, the gate electrode(s) as well as covering the electrochemically active element. This layer of solidified electrolyte may be continuous or interrupted, depending partly on which of two main types of transistor architectures is to be realised between the antenna pads (see below).

The electrochemical transmitter device according to the invention allows for control of electron flow between source and drain contacts and hence between the two antenna pads of the antenna member of the transmitter. The conductivity of the transistor channel of the electrochemically active element can be modified, through altering of the redox state of the organic material therein and thereby altering the antenna characteristics. This is achieved by application of a voltage to the gate electrode(s), which generates an electric field in the electrolyte. In the contact area between electrolyte and electrochemically active element, electrochemical redox reactions take place, which change the conductivity of the organic material. Either the organic material in the transistor channel is modified from a conducting state to a non-conducting state as a result of said redox reactions, or it is modified from a non-conducting to a conducting state. If applying a high enough voltage to the gate electrode(s), the electrochemically active element might in some cases experience an irreversible redox reaction which permanently affects the conductivty of the element. In some cases, it is even possible to render the element essentially non-conducting. This is the case for example if the electrochemically active element is made of PEDOT:PSS, and results in the antenna pads (or the antenna pad and ground) being permanently insulated from each other. Thus, the antenna characteristics of such a device is permanently changed giving the device a permanent memory function. Consequently, such a device can be used as a permanently programmable logic element, for example defining a logic zero if the active element is rendered non-conducting and a logic one if it is not rendered non-conducting. Once programmed, the binary information can be read out remotely by a suitable read out device detecting the antenna characteristics.

Depending on the precise patterning of the conducting organic material and the electrolyte, the electrochemical transistor member of the transmitter according to the invention can either be of a bi-stable or a dynamic type. In the bi-stable transistor embodiment, a voltage applied to the gate electrode(s) leads to a change in conductivity in the transistor channel that is maintained when the external circuit is broken, i e when the applied voltage is removed. The electrochemical reactions induced by the applied voltage can not be reversed, since the electrochemically active element and the gate electrode(s) are not in direct electrical contact with each other, but separated by electrolyte. In this embodiment, the transistor channel can be switched between non-conducting and conducting states using only small, transient gate voltages. The bi-stable transistor can be kept in an induced redox state for days, and, in the most preferred, ideal case, indefinitely. The device is thus provided with a permanent memory function which, contrary to the above-mentioned irreversible redox reaction, is re-programmable.

Thus, the bi-stable transistor embodiment of the present invention offers a memory function, in that it is possible to switch it on or off using only a short voltage pulse applied to the gate electrode. The transistor stays in the conducting or non-conducting redox state even after the applied voltage has been removed. A further advantage with such bi-stable transistors is that close to zero-power operation is made possible, since the short voltage pulses applied to the gate need not be larger than a fraction of the gate voltages needed for operation of a corresponding dynamic device.

In the dynamic transistor embodiment, the change in the redox state of the material is reversed spontaneously upon withdrawal of the gate voltage. This reversal is obtained through the provision of a redox sink volume adjacent to the transistor channel in the electrochemically active element. Also, a second gate electrode is provided, and arranged so that the two gate electrodes are positioned on either side of the electrochemically active element, one closer to the transistor channel, and the other closer to the redox sink volume. Both gate electrodes are separated from the electrochemically active element by electrolyte. Application of a voltage between the two gate electrodes results in the electrochemically active element being polarised, whereby redox reactions take place in which the organic material in the transistor channel is reduced while the organic material in the redox sink volume is oxidised, or vice versa, and hence the antenna response is modulated. Since the transistor channel and the redox sink volume are in direct electrical contact with each other, withdrawal of gate voltage leads to a spontaneous reversal of the redox reactions, so that the initial conductivity of the transistor channel is re-established.

The electrochemical transmitter device according to the invention is also particularly advantageous in that it can be easily realised on a support, such as polymer film or paper. Thus, the different components can be deposited on the support by means of conventional printing techniques such as screen printing, offset printing, ink-jet printing and flexographic printing, or coating techniques such as knife coating, doctor blade coating, extrusion coating and curtain coating, such as described in "Modern Coating and Drying Technology" (1992), eds E D Cohen and E B Gutoff, VCH Publishers Inc, New York, N.Y., USA. In those embodiments of the invention that utilise a conducting polymer as the organic material (see below for materials specifications), this material can also be deposited through in situ polymerisation by methods such as electropolymerisation, UV-polymerisation, thermal polymerisation and chemical polymerisation. As an alternative to these additive techniques for patterning of the components, it is also possible to use subtractive techniques, such as local destruction of material through chemical or gas etching, by mechanical means such as scratching, scoring, scraping or milling, or by any other subtractive methods known in the art. An aspect of the invention provides such processes for the manufacture of an electrochemical transmitter device from the materials specified herein.

According to a preferred embodiment of the invention, the electrochemical transistor member of the transmitter device is encapsulated, in part or entirely, for protection of the device. The encapsulation retains any solvent needed for e g the solidified electrolyte to function, and also keeps oxygen from disturbing the electrochemical reactions in the device. Encapsulation can be achieved through liquid phase processes. Thus, a liquid phase polymer or organic monomer can be deposited on the device using methods such as spray-coating, dip-coating or any of the conventional printing techniques listed above. After deposition, the encapsulant can be hardened for example by ultraviolet or infrared irradiation, by solvent evaporation, by cooling or through the use of a two-component system such as an epoxy glue, where the components are mixed together directly prior to deposition. Alternatively, the encapsulation is achieved through lamination of a solid film onto the electrochemical transistor member of the transmitter device. In preferred embodiments of the invention, in which the components of the electrochemical transistor member of the transmitter device are arranged on a support, this support can function as the bottom encapsulant. In this case encapsulation is made more convenient in that only the top of the sheet needs to be covered with liquid phase encapsulant or laminated with solid film.

In another preferred embodiment, such a printable transmitter device is provided, which is constructed from the same materials as a sensor. In this case, the sensor is used to modulate the characteristics of the transistor member of the device according to the invention. It is then possible to realise printable sensor memory circuitry for a transmitter device on the same support, using the same materials and deposition techniques as for the transmitting unit itself. An ensemble comprising a printable sensor memory and a transmitter device can then be printed, all at the same time, on a support.

The antenna member of the present invention may be, any known type. Basically, the antenna member is a dipole element, wherein the two antenna pads operate as radiating portions. By controlling the electron flow (i.e. the resistance) between the two pads, the frequency, power, phase and/or other parameters of the radio frequency response may be altered. The state of the transistor, and hence of the characteristics determining the state of the transistor, may be read out remotely by a similar antenna structure. Depending on which parameters of the radio frequency response that are altered, different types of remote read out structures can be used. A read-out device may for example comprise an antenna, identical or similar to the antenna in the device according to the invention, which is brought in proximity with the inventive device. A radio frequency emitted by the read-out device is reflected from the antenna member of the electrochemical device according to the present invention, and by virtue of the frequency response being dependent upon the state of the transistor member, information may be extracted.

The invention will now be further described with reference to specific embodiments thereof and to specific materials. This detailed description is intended for purposes of exemplification, not for limitation in any way of the scope of the invention as claimed.

BRIEF DESCRIPTION OF THE DRAWINGS

The following detailed description will be more thoroughly understood when read in conjunction with the accompanying drawings, on which

DETAILED DESCRIPTION OF PREFERRED EMBODIMENTS

Definitions

Figure 1A:
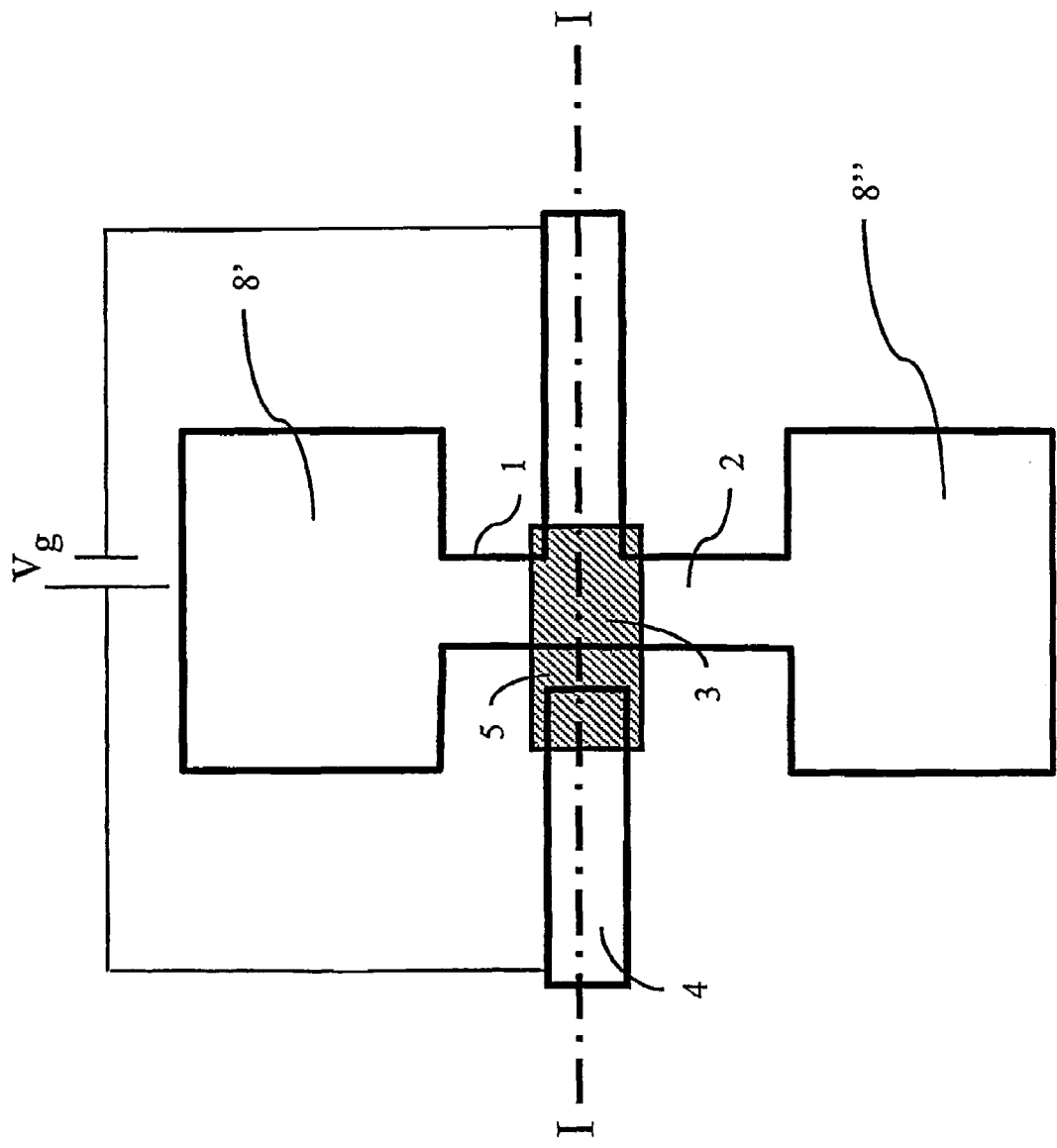
FIGS. 1A-C are schematic views of a structure of one embodiment of a transmitter device according to the invention, wherein the antenna member is connected to a bi-stable transistor, showing (A) a top view and (B) a cross-section along I-I in A, and (C) an alternative embodiment wherein the drain of the transistor member is connected to ground.

Bi-stable electrochemical transistor: an electrochemical transistor device in which the transistor channel retains its redox state (and hence its conductivity characteristics) when the gate voltage is removed.

Dynamic electrochemical transistor: an electrochemical transistor device in which the transistor channel spontaneously returns to its initial redox state (and hence to its initial conductivity characteristics) when the gate voltage is removed.

Source contact: An electrical contact that provides charge carriers to a transistor channel. According to the present invention, the source contact is connected to one of the pads of a capacitively coupled device (i.e. the first pad of the antenna member).

Drain contact: An electrical contact that accepts charge carriers from a transistor channel. According to the present invention, the drain contact is connected to one of the plates of an capacitive coupled device or coupled to ground (i.e. the second pad of the antenna member or to ground).

Gate electrode: an electrical contact of which any fraction of the surface area is in direct electrical contact with solidified electrolyte, and therefore in ionic contact with the electrochemically active element.

Electrochemically active element: an "electrochemically active element" according to the present invention, is a piece of a material comprising an organic material having a conductivity that can be electrochemically altered through changing of the redox state of said organic material. The electrochemically active element is in ionic contact with at least one gate electrode via a solidified electrolyte. The electrochemically active element may furthermore be integrated with each of the source and drain contacts individually or with both of them, being composed of the same or different materials. The electrochemically active element in the electrochemical transistor devices of the invention comprises a transistor channel, and may furthermore comprise a redox sink volume.

Transistor channel: the "transistor channel" of the electrochemically active element establishes electrical, contact between source and drain contacts.

Redox sink volume: in certain embodiments of the invention, the electrochemically active element further comprises a "redox sink volume". This is a part of the electrochemically active element adjacent to and in direct electrical contact with the transistor channel, which can provide or accept electrons to or from the transistor channel. Thus, any redox reactions within the transistor channel are complemented by opposing reactions within the redox sink volume.

Redox state: when reference is made to changes in the "redox state" of the electrochemically active element, this is intended to include cases where the organic material in the electrochemically active element is either oxidised or reduced, as well as cases where there is a redistribution of charges within the electrochemically active element, so that one end (e g the transistor channel) is reduced and the other end (e g the redox sink volume) is oxidised. In the latter case, the electrochemically active element as a whole retains its overall redox state, but its redox state has nevertheless been changed according to the definition used herein, due to the internal redistribution of charge carriers.

Direct electrical contact: Direct physical contact (common interface) between two phases (for example electrode and electrolyte) that allows for the exchange of charges through the interface. Charge exchange through the interface can comprise transfer of electrons between electrically conducting phases, transfer of ions between ionically conducting phases, or conversion between electronic current and ionic current by means of electrochemistry at an interface between for example electrode and electrolyte or electrolyte and electrochemically active element, or by occurrence of capacitive currents due to the charging of the Helmholtz layer at such an interface.

Solidified electrolyte: for the purposes of the invention, "solidified electrolyte" means an electrolyte, which at the temperatures at which it is used is sufficiently rigid that particles/flakes in the bulk therein are substantially immobilised by the high viscosity/rigidity of the electrolyte and that it doesn't flow or leak. In the preferred case, such an electrolyte has the proper rheological properties to allow for the ready application of this material on a support in an integral sheet or in a pattern, for example by conventional printing methods. After deposition, the electrolyte formulation should solidify upon evaporation of solvent or because of a chemical cross-linking reaction, brought about by additional chemical reagents or by physical effect, such as irradiation by ultraviolet, infrared or microwave radiation, cooling or any other such. The solidified electrolyte preferably comprises an aqueous or organic solvent-containing gel, such as gelatine or a polymeric gel. However, solid polymeric electrolytes are also contemplated and fall within the scope of the present invention. Furthermore, the definition also encompasses liquid electrolyte solutions soaked into, or in any other way hosted by, an appropriate matrix material, such as a paper, a fabric or a porous polymer. In some embodiments of the invention, this material is in fact the support upon which the electrochemical transistor device is arranged, so that the support forms an integral part of the operation of the device.

Materials

Preferably, the antenna pad(s) are made from a printable or printing process compatible, conducting material. It is preferred that this conducting material is a material that can be handled in a "roll-to-roll" process, such as printing and lamination etc. The conducting material is preferably a metallic foil such as aluminium, brass or copper, or is chosen from the group of conducting inks available such as silver-, carbon-inks or a conducting organic and/or polymeric coating or ink.

The organic material for use in the antenna member of the present invention preferably comprises a polymer which is electrically conducting in at least one oxidation state and optionally further comprises a polyanion compound. Conductive polymers for use in the electrochemical transistor member of the invention are preferably selected from the group consisting of polythiophenes, polypyrroles, polyanilines, polyisothianaphthalenes, polyphenylene vinylenes and copolymers thereof such as described by J C Gustafsson et al in Solid State Ionics, 69, 145-152 (1994); Handbook of Oligo- and Polythiophenes, Ch 10.8, Ed D Fichou, Wiley-VCH, Weinhem (1999); by P Schottland et al in Macromolecules, 33, 7051-7061 (2000); Technology Map Conductive Polymers, SRI Consulting (1999); by M Onoda in Journal of the Electrochemical Society, 141, 338-341 (1994); by M Chandrasekar in Conducting Polymers, Fundamentals and Applications, a Practical Approach, Kluwer Academic Publishers, Boston 1999); and by A J Epstein et al in Macromol Chem, Macromol Symp, 51, 217-234 (1991). In an especially preferred embodiment, the organic material is a polymer or copolymer of a 3,4-dialkoxythiophene, in which said two alkoxy groups may be the same or different or together represent an optionally substituted oxy-alkylene-oxy bridge. In the most preferred embodiment, the polymer is a polymer or copolymer of a 3,4-dialkoxythiophene selected from the group consisting of poly3,4-methylenedioxythiophene), poly3,4-methylenedioxythiophene) derivatives, poly3,4-ethylenedioxythiophene), poly3,4-ethylenedioxythiophene) derivatives, poly3,4-propylenedioxythiophene), poly3,4- propylenedioxythiophene) derivatives, poly3,4-butylenedioxythiophene), poly3,4-butylenedioxythiophene) derivatives, and copolymers therewith. The polyanion compound is then preferably polystyrene sulphonate).

Preferably, the solidified electrolyte, used in the transistor member of the present invention, comprises a binder. It is preferred that this binder have gelling properties. The binder is preferably selected from the group consisting of gelatine, a gelatine derivative, polyacrylic acid, polymethacrylic acid, poly(vinylpyrrolidone), polysaccharides, polyacrylamides, polyurethanes, polypropylene oxides, polyethylene oxides, poly(styrene sulphonic acid) and poly(vinyl alcohol) and salts and copolymers thereof; and may optionally be crosslinked. The solidified electrolyte preferably further comprises an ionic salt, preferably magnesium sulphate if the binder employed is gelatine. The solidified electrolyte preferably further contains a hygroscopic salt such as magnesium chloride to maintain the water content therein.

The organic material for use in the present invention preferably comprises a polymer which is electrically conducting in at least one oxidation state and optionally further comprises a polyanion compound. Conductive polymers for use in the electrochemical transistor device of the invention are preferably selected from the group consisting of polythiophenes, polypyrroles, polyanilines, polyisothianaphthalenes, polyphenylene vinylenes and copolymers thereof such as described by J C Gustafsson et al in Solid State Ionics, 69, 145-152 (1994); Handbook of Oligo- and Polythiophenes, Ch 10.8, Ed D Fichou, Wiley-VCH, Weinhem (1999); by P Schottland et al in Macromolecules, 33, 7051-7061 (2000); Technology Map Conductive Polymers, SRI Consulting (1999); by M Onoda in Journal of the Electrochemical Society, 141, 338-341 (1994); by M Chandrasekar in Conducting Polymers, Fundamentals and Applications, a Practical Approach, Kluwer Academic Publishers, Boston (1999); and by A J Epstein et al in Macromol Chem, Macromol Symp, 51, 217-234 (1991). In an especially preferred embodiment, the organic material is a polymer or copolymer of a 3,4-dialkoxythiophene, in which said two alkoxy groups may be the same or different or together represent an optionally substituted oxy-alkylene-oxy bridge. In the most preferred embodiment, the polymer is a polymer or copolymer of a 3,4-dialkoxythiophene selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene), poly(3,4-butylenedioxythiophene) derivatives, and copolymers therewith. The polyanion compound is then preferably poly(styrene sulphonate).

The support in some embodiments of the transmitter device according to the present invention is preferably selected from the group consisting of polyethylene terephthalate; polyethylene naphthalene dicarboxylate; polyethylene; polypropylene; paper; coated paper, e.g. coated with resins, polyethylene, or polypropylene; paper laminates; paperboard; corrugated board; glass and polycarbonate.

Principal Device Architectures

The different transistors possible to incorporate into the capacitive coupled antenna structures:

By patterning of the organic material of the electrochemically active element and of the contacts, electrode(s) and electrolyte in different ways, two main types of electrochemical transistor devices can be realised. Electrochemical devices according to the invention, based on these main types, namely bi-stable and dynamic electrochemical transistor devices, will now be exemplified along with reference to figures thereof and an outline of their working principles.

Figure 1B:
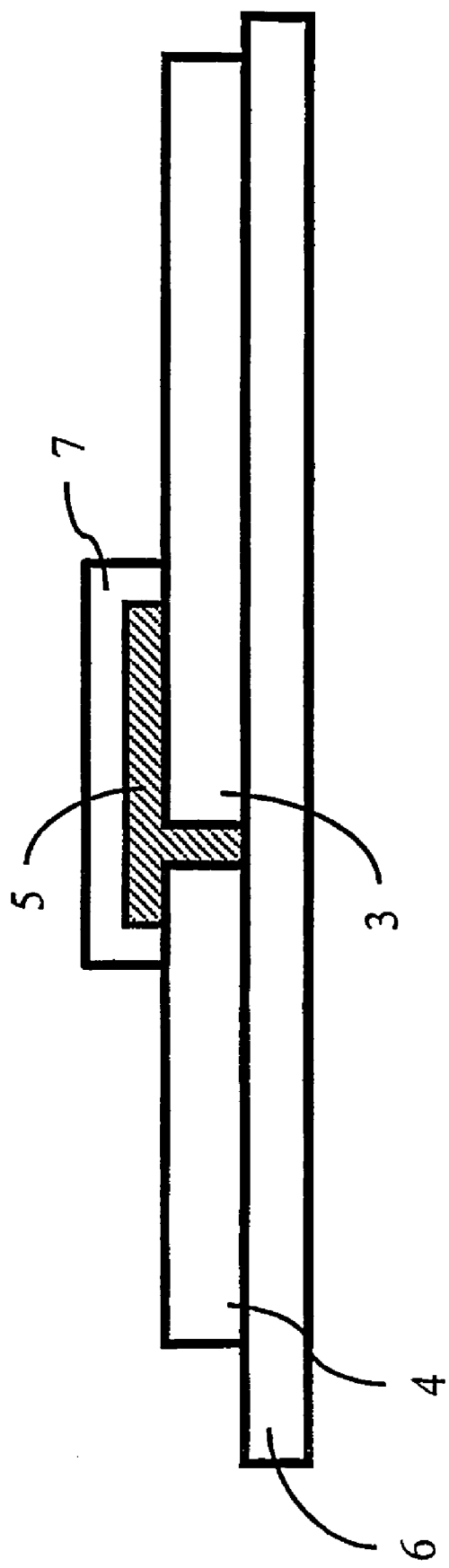
Figure 10A:
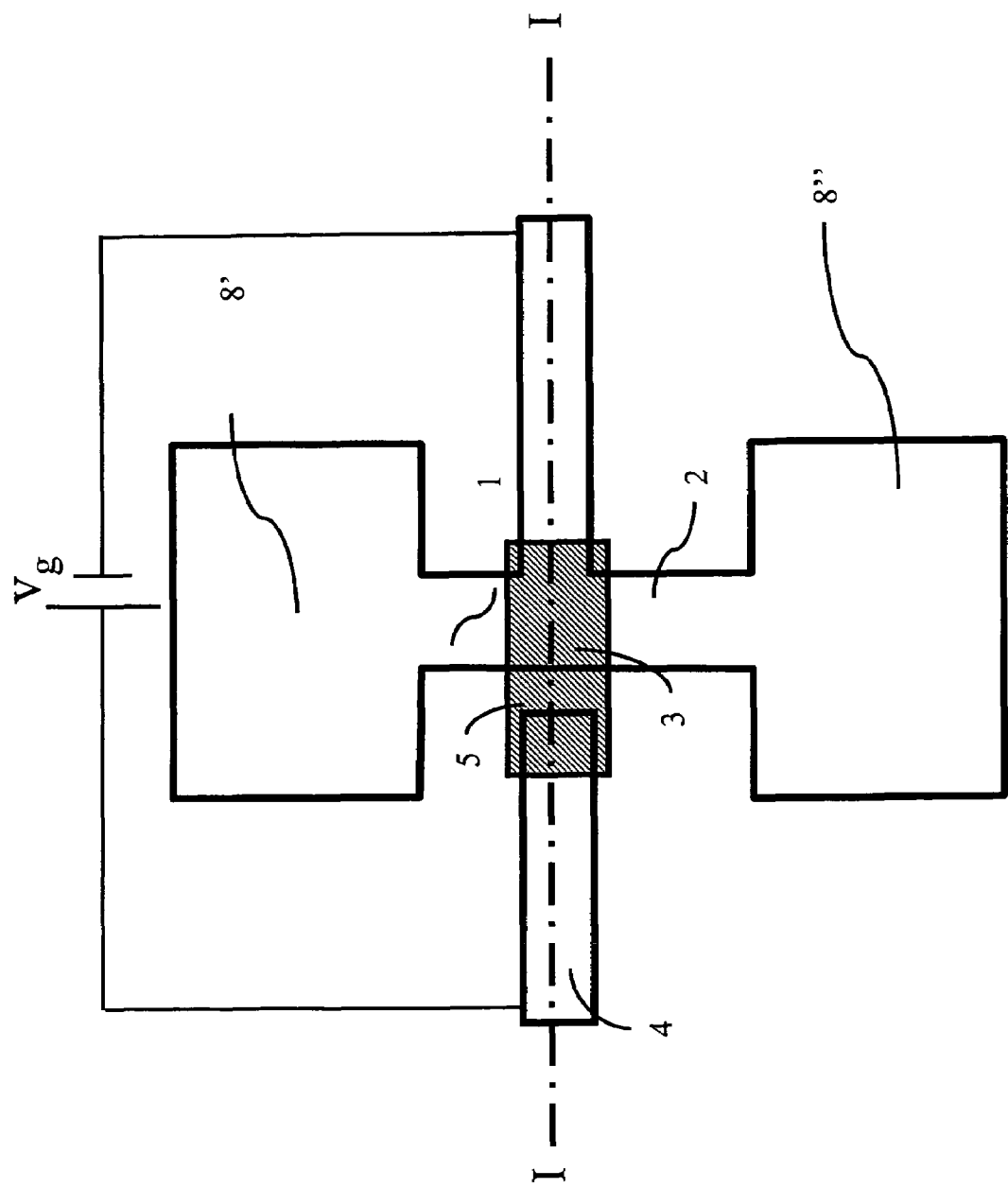
FIGS. 10A and 10B disclose a self-supporting device
Figure 10B:
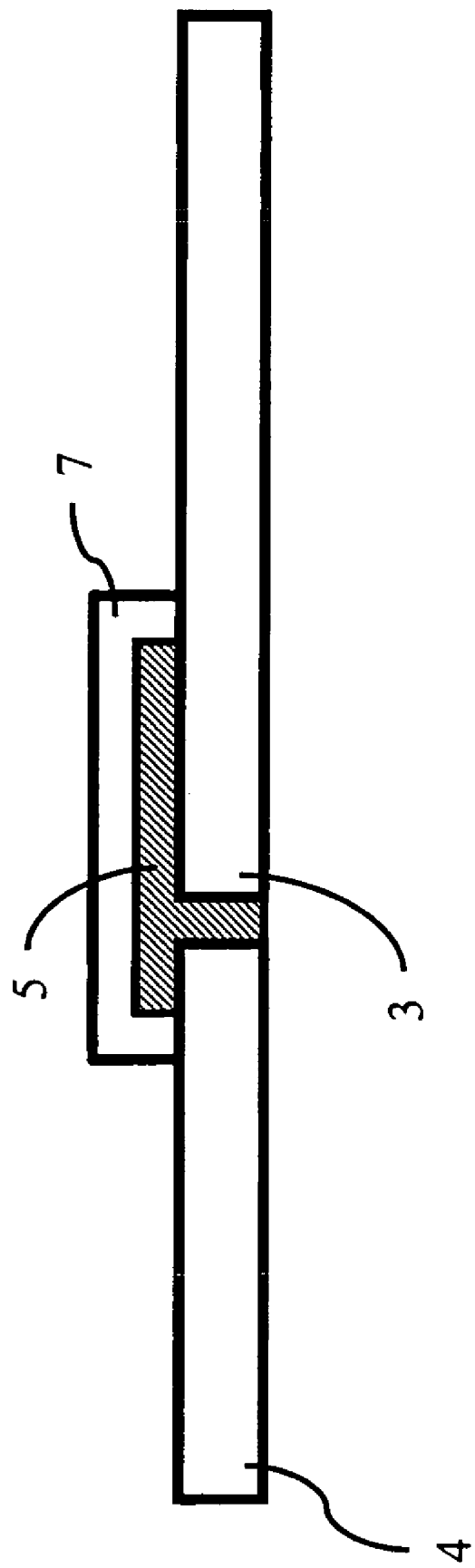

Bi-stable Transistor (Type 1): FIGS. 1A and 1B schematically show one embodiment of the present invention, wherein a bi-stable transistor is employed. The transistor comprises a source contact 1, a drain contact 2 and an electrochemically active element 3, which have all been formed from a continuous piece of organic material. The source contact 1 is in direct electrical contact with the first pad 8' of the antenna member, and the drain contact 2 is in direct electrical contact with the second pad 8" of the antenna member. Both the source and drain contacts are in electrical contact with an external power source, which allows the application of a voltage $V_{ds}$ between them. The transistor further comprises a gate electrode 4, which can be formed from the same organic material as the source and drain contacts and the electrochemically active element. The gate electrode 4 is in electrical contact with an external power source, which allows applying a voltage $V_g$ between the gate electrode and the electrochemically active element. This can be realised by applying $V_g$ between the gate 4 and the source 1 or the drain 2, or directly between the gate 4 and the electrochemically active element 3. All of these organic material components have been deposited in one layer on a support 6. On top of this layer, covering part of the gate electrode 4 and the active element 3, is a layer of gel electrolyte 5. Furthermore, the gel electrolyte layer 5 is covered with an encapsulating layer 7 for prevention of solvent evaporation. FIGS. 10A and 10B show a self-supporting device.

Working principle for the polarity of $V_g$ shown in FIG. 1, and in the case of an organic material which is conducting in its oxidised state and non-conducting when reduced to its neutral state: when a gate voltage $V_g$ is applied between the gate electrode 4 and the electrochemically active element 3, the gate electrode is polarised positive (anode), and the electrochemically active element is polarised negative (cathode). This leads to onset of electrochemistry in the electrochemically active element and at the gate electrode; the organic material in the transistor channel is reduced at the same time as an oxidation reaction takes place at the gate electrode. The reduced material in the transistor channel displays a drastically diminished electrical conductivity, which results in the closure of the transistor channel and an effective reduction of the current between source and drain for a given source-drain voltage $V_{ds}$, i.e. the transistor is in an "off" mode. When the external circuit supplying voltage to the gate electrode and the electrochemically active element is broken, the oxidation state of the transistor channel is maintained. No reversal of the electrochemical reactions is possible because of the interruption by electrolyte 5 of electron flow between gate electrode 4 and electrochemically active element 3.

Thus, the bi-stable transistor has a memory-function: It is possible to switch on or off the transistor channel with short pulses of gate voltage, $V_g$, applied to the gate. The respective conductivity states remain when gate voltage is removed (a zero-power device). Further adjustments of conduction characteristics in the electrochemically active element, or resetting thereof to the initial, high conductivity mode, can be performed by applying different voltages to the gate electrode.

Consequently, by operating the transistor member of the device, the characteristics of the antenna member can be controlled.

Figure 1C:
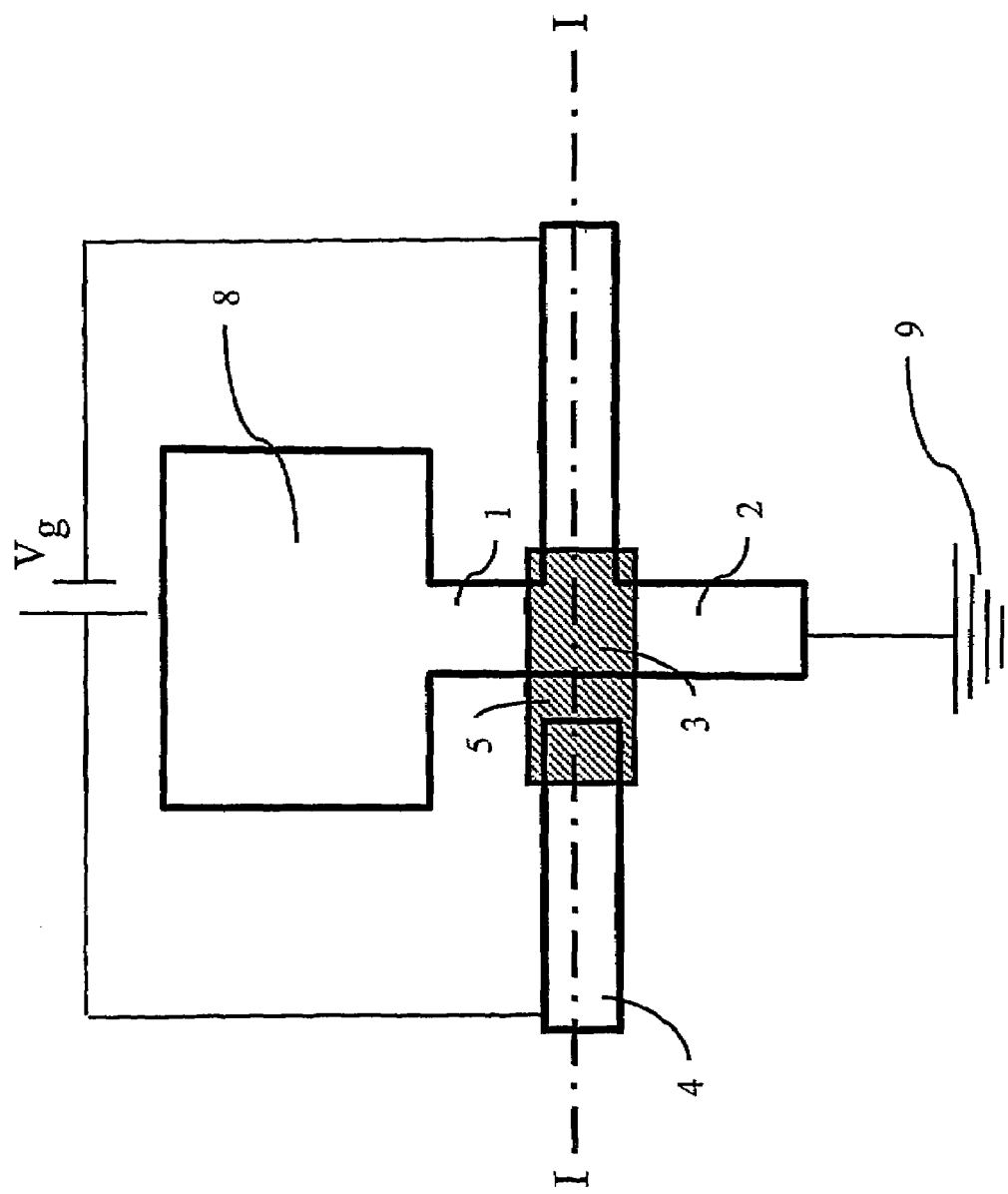

FIG. 1C shows an alternative embodiment, wherein the second antenna pad is omitted and the drain of the transistor member is connected directly to ground potential.

Figure 2A:
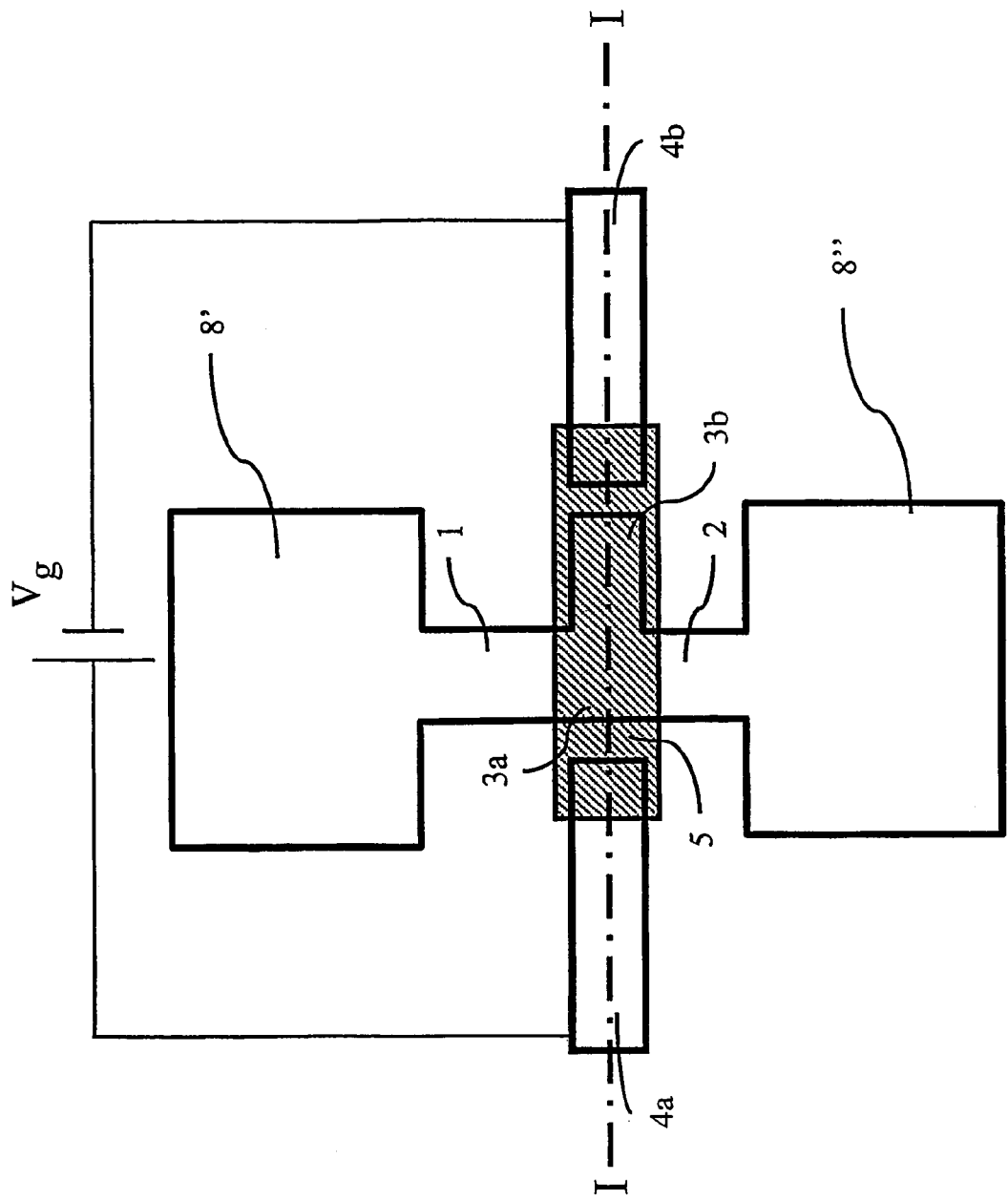
FIG. 2A-C are schematic views of a structure of a transmitter device according to the invention, wherein the antenna member is connected to a dynamic transistor, showing (A) a top view and (B) a cross-section along I-I in A, and (C) an alternative embodiment wherein the drain of the transistor member is connected to ground.
Figure 2B:
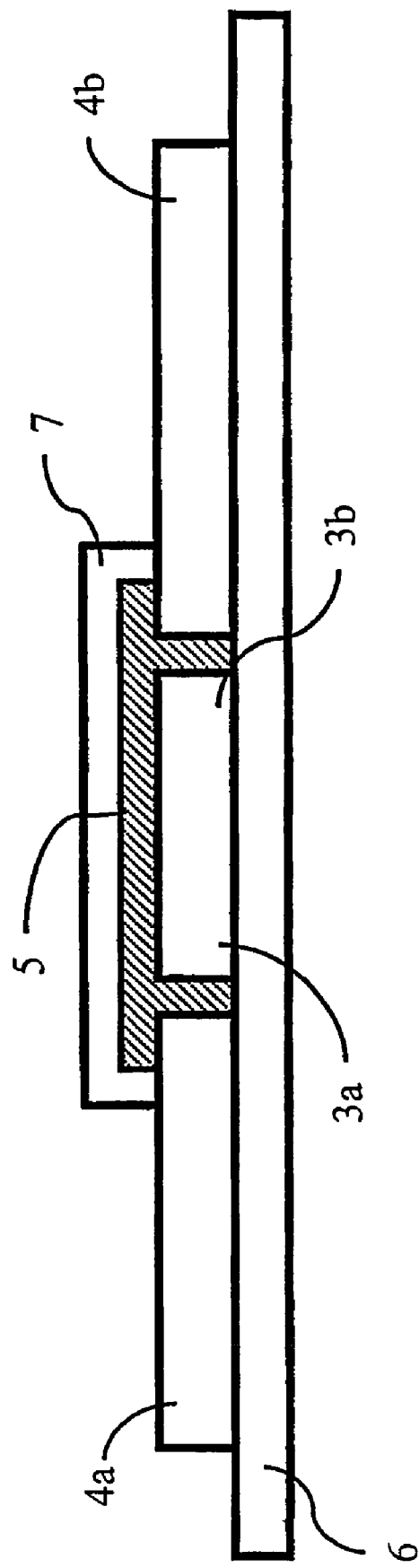

Dynamic transistor: FIGS. 2A and 2B schematically show a device according to the invention employing a dynamic transistor. The transistor comprises a source contact 1, a drain contact 2 and an electrochemically active element 3, which have all been formed from a continuous piece of organic material. The source contact 1 is in direct electrical contact with the first pad 8' of the antenna member, and the drain contact 2 is in direct electrical contact with the second pad 8" of the antenna member. The electrochemically active element 3 comprises a transistor channel 3a and a redox sink volume 3b. Both the source and drain contacts are in electrical contact with an external power source, which allows the application of a voltage $V_{ds}$, between them. The transistor further comprises two gate electrodes 4a and 4b arranged on either side of the electrochemically active element 3. The gate electrodes can be formed from the same organic material as the source and drain contacts and the electrochemically active element. The gate electrodes are in electrical contact with an external power source, which allows application of a voltage $V_g$ between them. All of these organic material components have been deposited in one layer on a support 6. On top of this layer, covering parts of the gate electrodes 4a and 4b and the active element 3, is a layer of gel electrolyte 5. Furthermore, the gel electrolyte layer 5 is covered with an encapsulating layer 7 for prevention of solvent evaporation.

Working principle for the polarity of $V_g$ shown in FIG. 2, and in the case of an organic material which is conducting in its oxidised state and non-conducting when reduced to its neutral state: when a gate voltage $V_g$ is applied between the gate electrodes 4a and 4b, gate electrode 4a is polarised positive (anode), and gate electrode 4b is polarised negative (cathode). This leads to onset of electrochemistry in the electrochemically active element; the organic material in the transistor channel 3a (adjacent to gate electrode 4a) is reduced, while the organic material in the redox sink volume 3b (adjacent to gate electrode 4b) is oxidised. These electrochemical reactions require an internal transfer of electrons within the electrochemically active element. Electrons that are released in the oxidation reaction in the redox sink volume migrate to the transistor channel, where they replenish the electrons consumed in the reduction of organic material occurring in this segment of the electrochemically active element. The reduced volume in the transistor channel displays a drastically diminished electrical conductivity, which results in the closure of the transistor channel and an effective reduction of the source-drain current for a given source drain voltage $V_{ds}$, i e the transistor is "off". When the external circuit applying voltage to the gate electrodes 4a and 4b is broken, a spontaneous discharge occurs, in that electrons flow from the reduced material in the transistor channel to the oxidised material in the redox sink volume, until the original redox state is re-established within the electrochemically active element. For maintenance of overall charge neutrality, this flow of electrons within the electrochemically active element is accompanied by an ion flow within the solidified electrolyte.

Figure 2C:
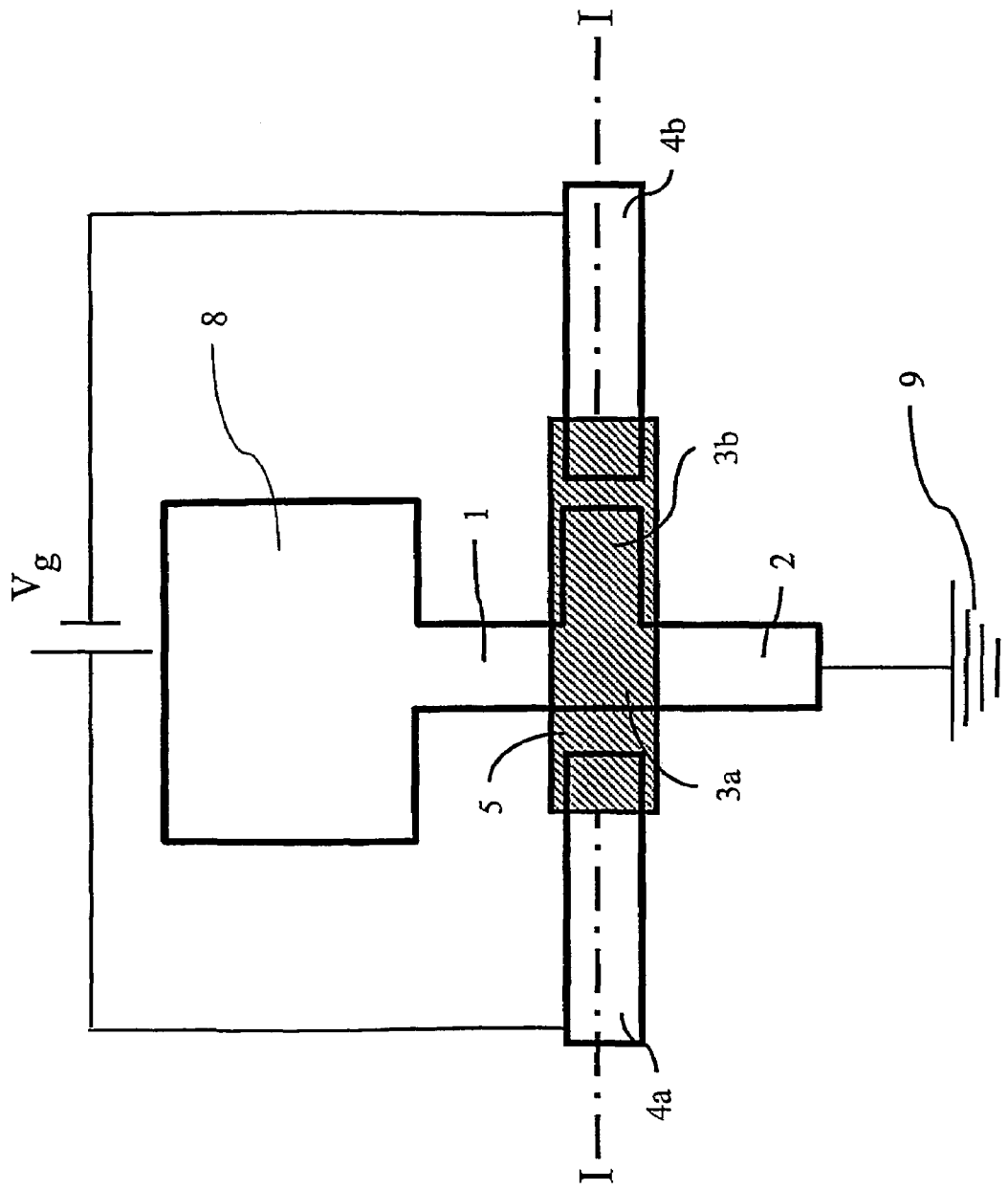

FIG. 2C shows an alternative embodiment, wherein the second antenna pad is omitted and the drain of the transistor member is connected directly to ground potential.

Figure 3A:
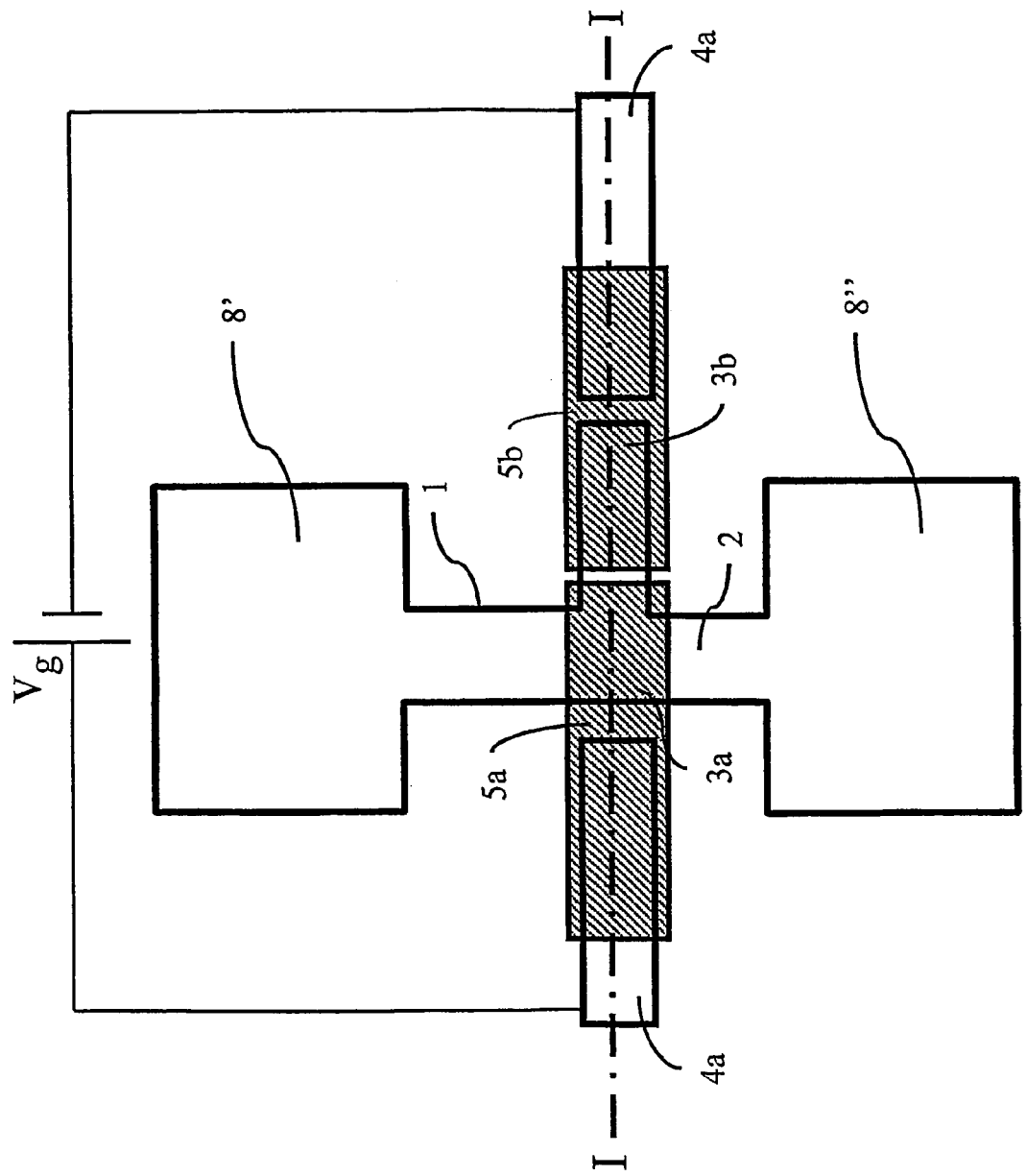
FIG. 3A-C are schematic views of a structure of another embodiment of a transmitter device according to the invention, wherein the antenna member is connected to a bi-stable transistor, showing (A) a top view and (B) a cross-section along I-I in A, and (C) an alternative embodiment wherein the drain of the transistor member is connected to ground.
Figure 3B:
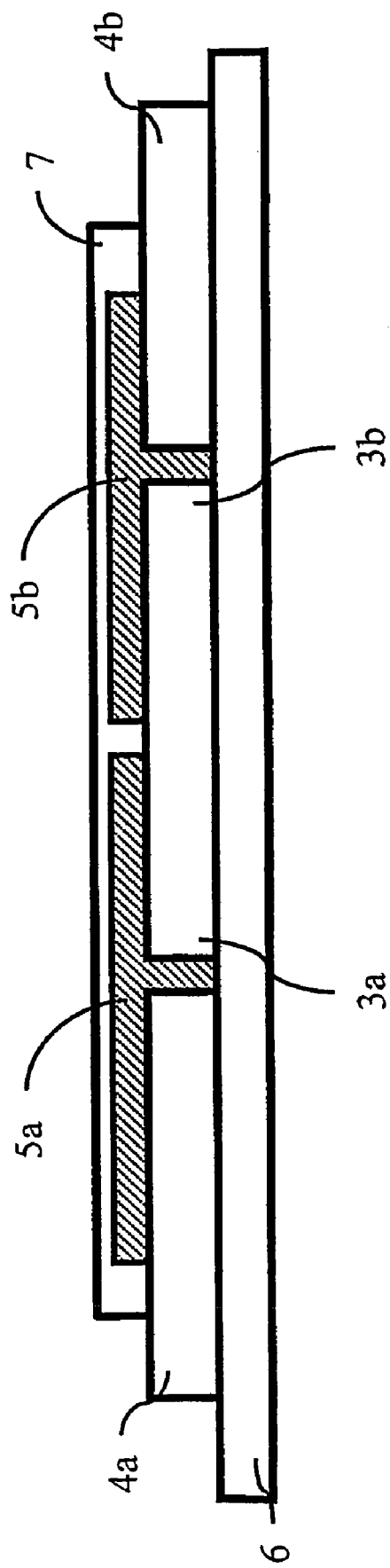

Bi-stable transistor (type 2): FIGS. 3A and 3B schematically show another embodiment of the present invention employing a bi-stable transistor, the architecture of which is based on the dynamic transistor architecture described above. With reference to FIGS. 3A and 3B, this embodiment of a bi-stable transistor has the same components as said dynamic transistor, the difference being that the layer of solidified electrolyte 5 is patterned, forming two separate segments of electrolyte 5a and 5b. This patterning has the effect of interrupting ion flow within the electrolyte, which interruption in turn means that no spontaneous reversal of electrochemical reactions can occur between transistor channel 3a and redox sink volume 3b. In similarity to the case of the first bi-stable transistor device described above, the oxidation state of the transistor channel is maintained when the external circuit, here supplying voltage to the gate electrodes, is broken.

Figure 3C:
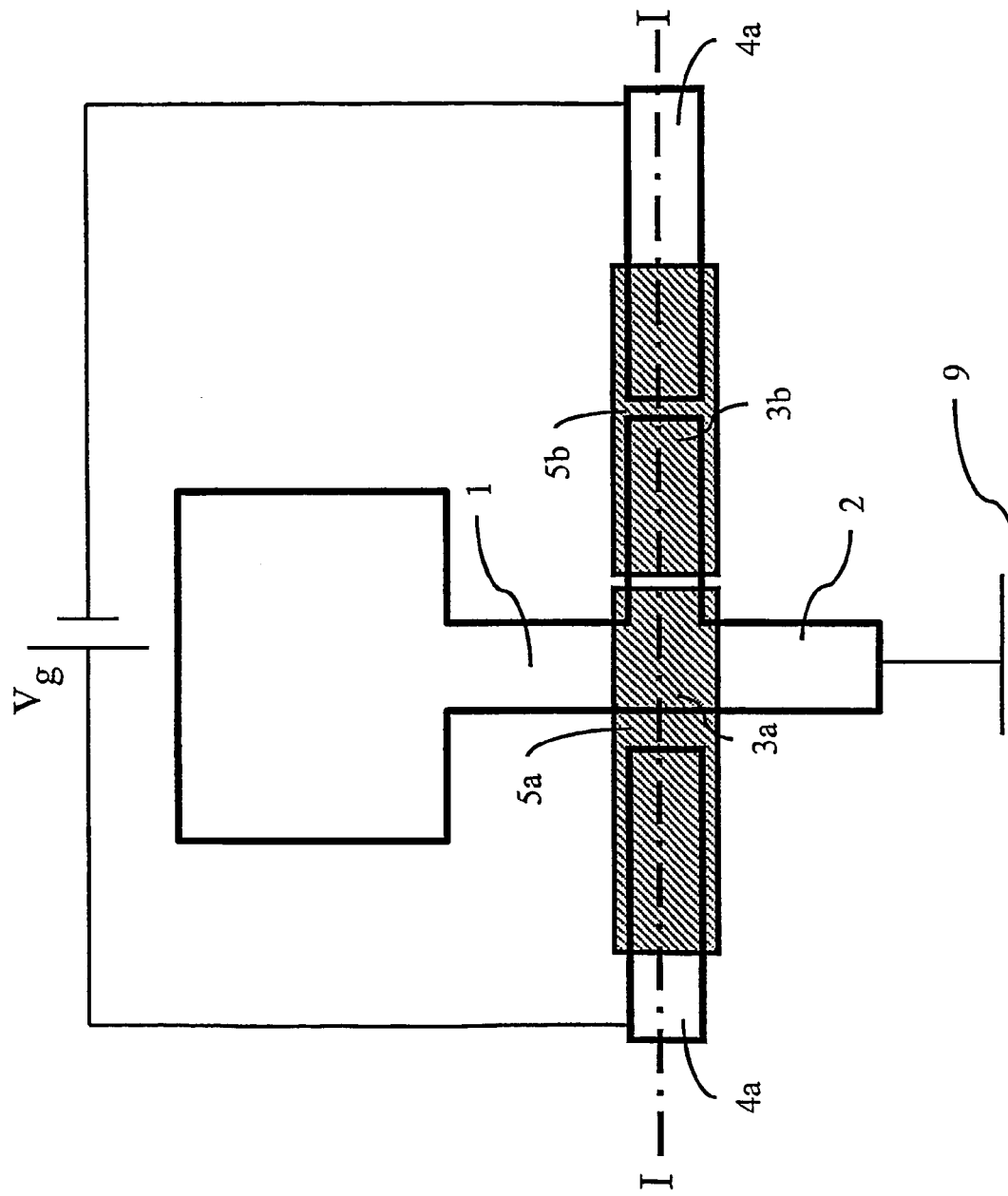

FIG. 3C shows an alternative embodiment, wherein the second antenna pad is omitted and the drain of the transistor member is connected directly to ground potential.

Experiments

The antenna pads and the Bi-stable (type 1) transistors were realised by patterning films of partially oxidised poly(3, 4-ethylenedioxythiophene) with poly(styrene sulphonate) as counterions (frequently referred to as PEDOT:PSS in the present text) into a T-shaped structure with one antenna pad connected to the source electrode and the other antenna pad connected to the gate electrode. The antenna pads were also patterned from the same films of partially oxidised poly(3,4-ethylenedioxythiophene) with poly(styrene sulphonate) as counterions. The design followed the schematic drawings of the bi-stable transistor in combination with two antenna pads presented in FIG. 1. In its pristine, partially oxidised state, PEDOT:PSS films are conductive, providing the opportunity of modulating the current in the transistor channel, between the two antenna pads, by reduction and oxidation of the PEDOT:PSS electrochemically. All processing and material handling was done in ambient atmosphere.

Patterning through screen-printing: PEDOT:PSS was applied as a thin film on a polyester carrier, Orgacon™ EL-300Ω/square, as provided by AGFA. Conducting patterns were generated using a screen-printed deactivation paste: Orgacon-Strupas gel, as provided by AGFA, was mixed with an aqueous sodium hypochlorite solution, resulting in a concentration of the active degradation agent of approximately 1.2%. Printing was performed using a manual screen printing board (Movivis, purchased from Schneidler) using a screen with 77 lines/cm mesh. After 1 minute, the deactivation agent was removed from the PEDOT:PSS film by washing thoroughly with copious amounts of water.

Deposition of gate electrode(s): After patterning of the PEDOT:PSS film, silver-paste (DU PONT 5000 Conductor) was printed on top of the PEDOT:PSS areas that form the gate electrode(s). Alternatively, the transistor part can be entirely made of organic materials by locally increasing the layer thickness of the PEDOT:PSS in the gate area(s) by drying-in of a PEDOT-PSS solution (Baytron P™ from Bayer) onto these areas. Such all-organic transistor members were successfully realised on polyester foils.

Deposition of gelled electrolyte: Calcium chloride (2%), iso-propanol (35%), and gelatine (10%) (Extraco gelatine powder 719-30) were dissolved in de-ionised water at approximately 50° C. (weight percentages of the resulting gel in parenthesis). Structures of gelled electrolyte on patterned PEDOT:PSS film were formed by printing the gel on top of the PEDOT:PSS film. The thickness of the gelled electrolyte ranged from 20 to 100 µm. Gelled electrolyte structures were realised at line widths down to 300 µm. Screen-printing of gelled electrolyte was performed using a 32 mesh screen.

Encapsulation: The gelled electrolyte was coated with a waterproof coating, such as plastic paint or foils, encapsulating the device. Shelf lifetimes of several months were achieved.

Electrical characterisation: All testing was performed in ambient atmosphere at room temperature. The transmitter/reader part consisted of a spectrum analyser and an inductor connected in parallel with the two antenna pads. Changes in the capacitive coupling to the electrochemical device according to the invention (a transponder) was then detected as an altered resonance frequency of the circuit.

Results

Two antenna pads connected to source and drain respectively of a Bi-stable transistor: A bi-stable transistor in combination with antenna pads such as that shown schematically in FIGS. 1A and 1B was realised. The transistor member of the device according to the invention had a transistor channel width of 5 mm and a gel width of 5 mm, with a transistor channel of 0.25 cm². However, smaller dimensions can be realised by using photolithographic photoresist patterning in combination with reactive ion plasma etching. Channel widths ranging from 5 to 20 μm and gel width of 20 μm can be realised.

Figure 4:
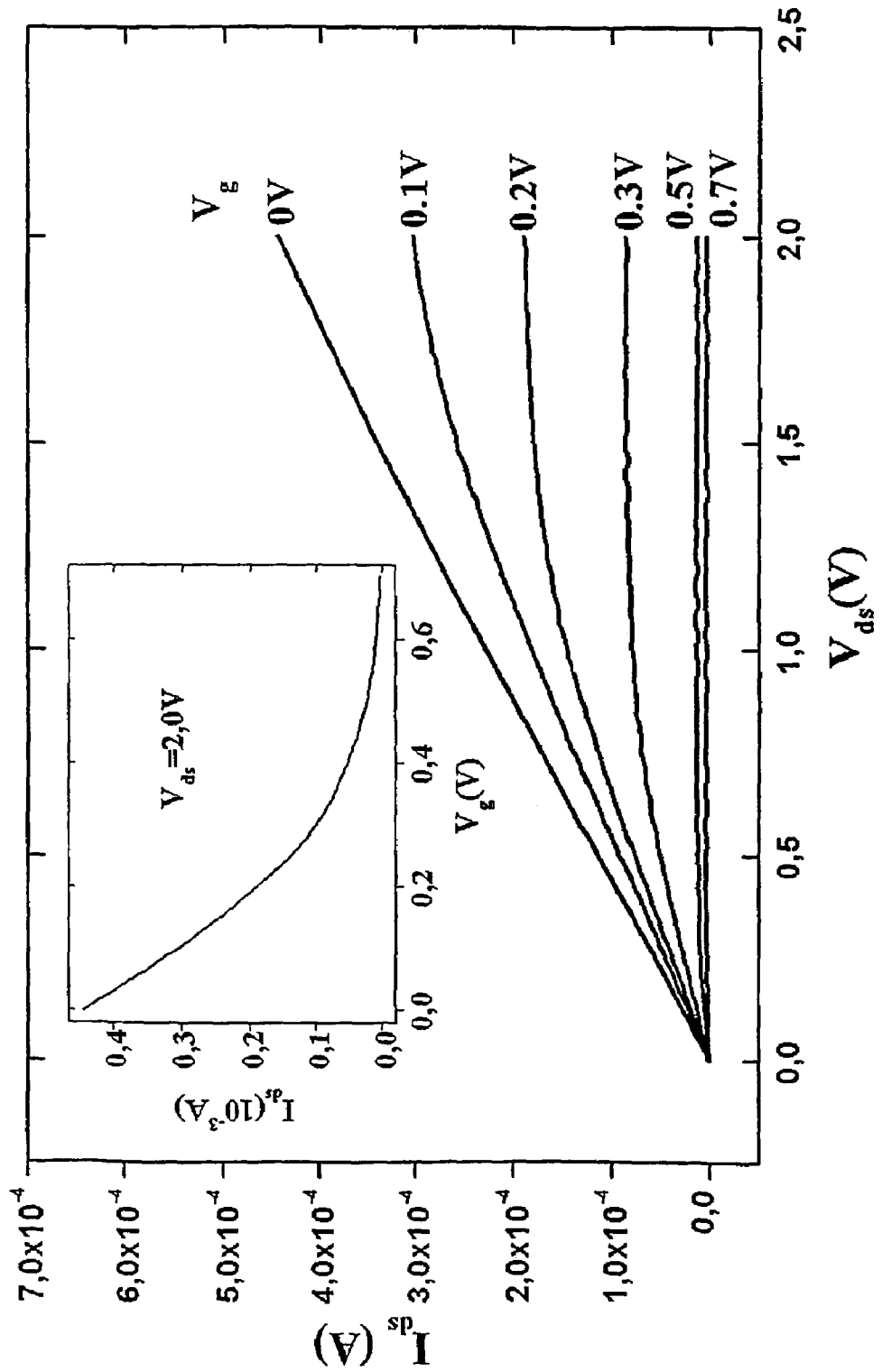
FIGS. 4 and 5 show the gate voltage dependency on drain/source voltage for a transistor member in accordance with the present invention.

The gate voltages $V_g$ applied to the gate electrode were in the interval between 0 V and 0.7 V in the reader signals are shown in FIG. 4.

Two antenna pads connected to source and drain respectively of a dynamic transistor: A dynamic transistor with two antenna pads connected to source and drain of a bi-stable transistor respectively, such as that shown schematically in FIGS. 2A and 2B was realised. The dynamic transistor had a channel width of 5 mm and a gel width of 5 mm, with a transistor channel of 0.25 cm². Smaller dimensions of PEDOT and gel patterns down to 4 μm can be reached using photolitographic patterning. Channel widths ranging from 4 to 20 μm and a gel width of 20 μm can thus be realised.

Figure 5:
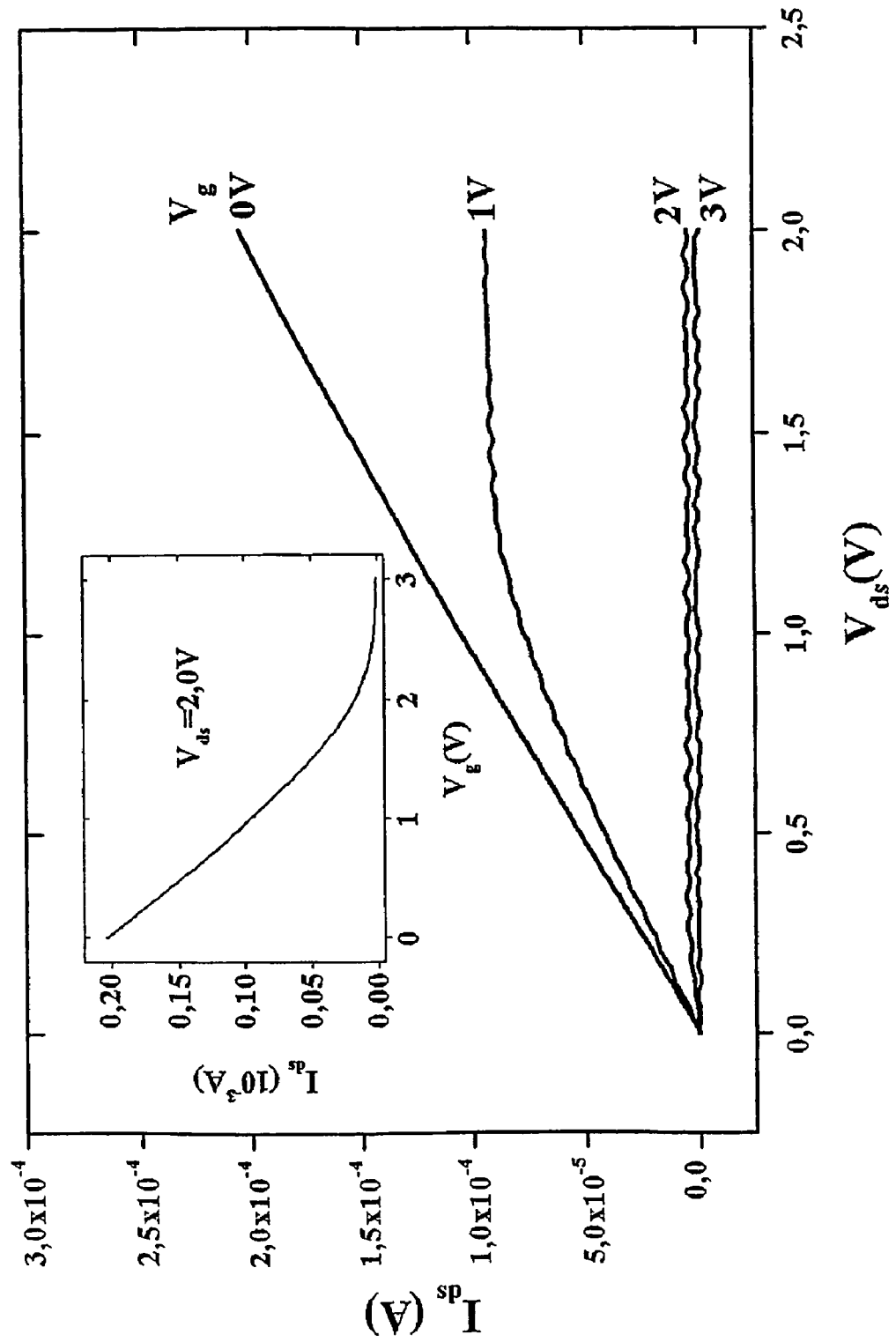

Typically, the gate voltages $V_g$ applied to the gate electrodes spanned an interval of 0 V to 3 V. FIG. 5 displays the reader output characteristics for different gate voltages applied (0 and 3 V).

Figure 6:
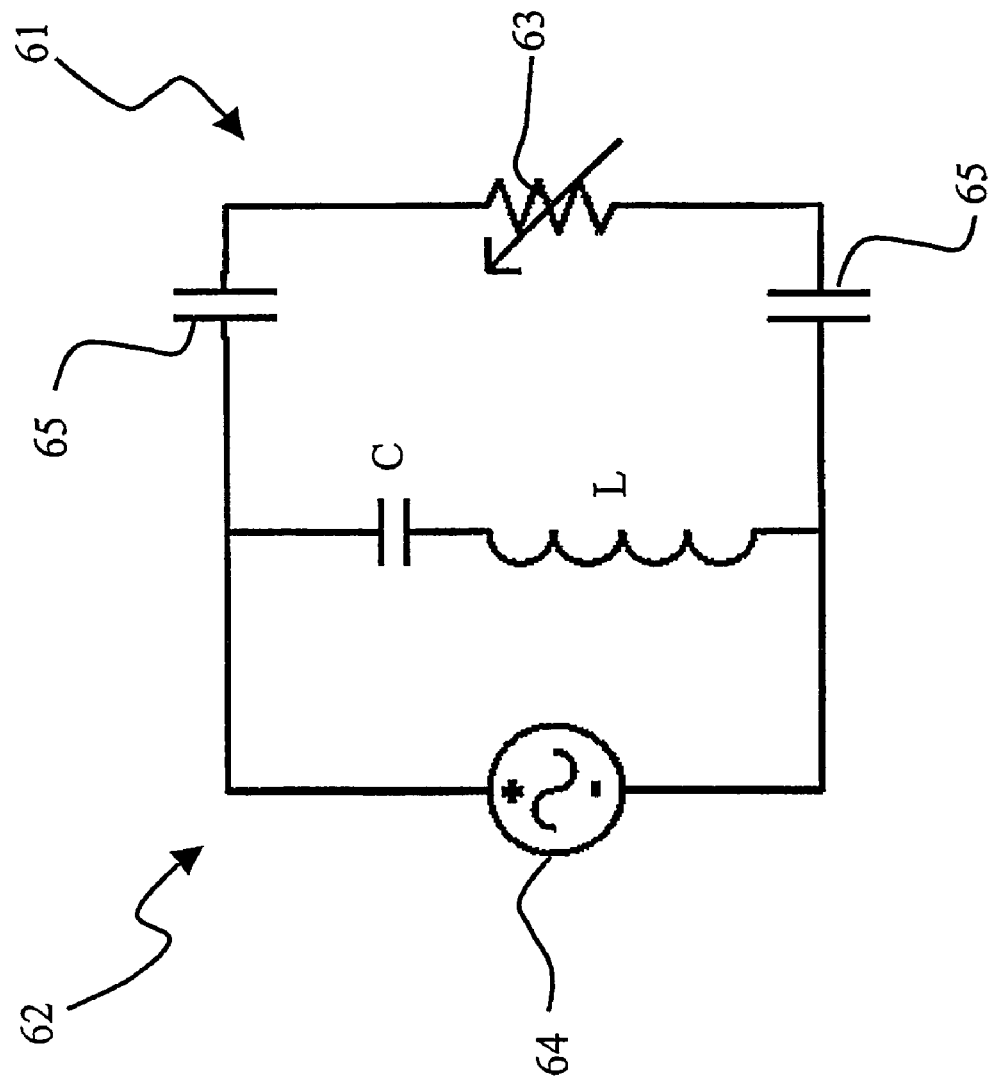
FIG. 6 shows schematically an electrochemical device according to the invention, along with a capacitively coupled read-out device.

The principle behind the read-out of the inventive device is schematically shown in FIG. 6. The antenna member along with the transistor member of the electrochemical device is outlined in the right portion 61 of FIG. 6, wherein the controllable resistance or impedance between the antenna pads is indicated as a variable resistor/impedance 63. It is to be understood that this variable resistor/impedance is, in fact, the transistor member of the device. The left portion 62 of FIG. 6 shows a read-out device, comprising a voltage supply and an LC-circuit. Furthermore, the read-out device comprises a receiver unit (not shown) for detection of the response from the electrochemical device according to the invention. When the read-out device is used for reading an electrochemical device, it is brought into capacitive contact with the same. In the figure, this is indicated by capacitors 65 between the read-out device 62 and the electrochemical device 61. It is to be understood that the read-out device may have a similar configuration to the electrochemical device.

Figure 7:
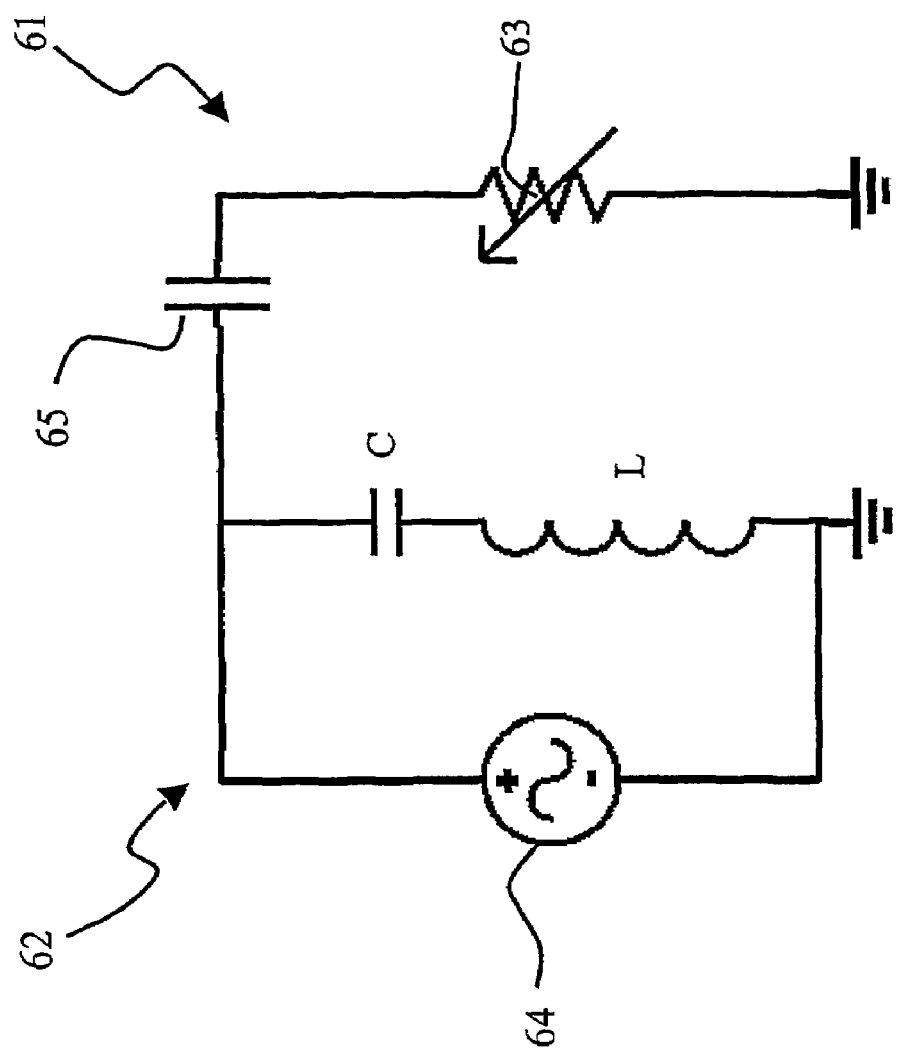
FIG. 7 shows schematically the capacitively coupled read-out device of FIG. 6, in a situation where the drain of the transistor member is coupled to ground, rather than to an antenna pad.

FIG. 7 shows a similar situation as in FIG. 6, wherein the drain of the transistor member is now connected to ground potential. In this case, the read-out device is also connected to ground potential, as shown.

Figure 8:
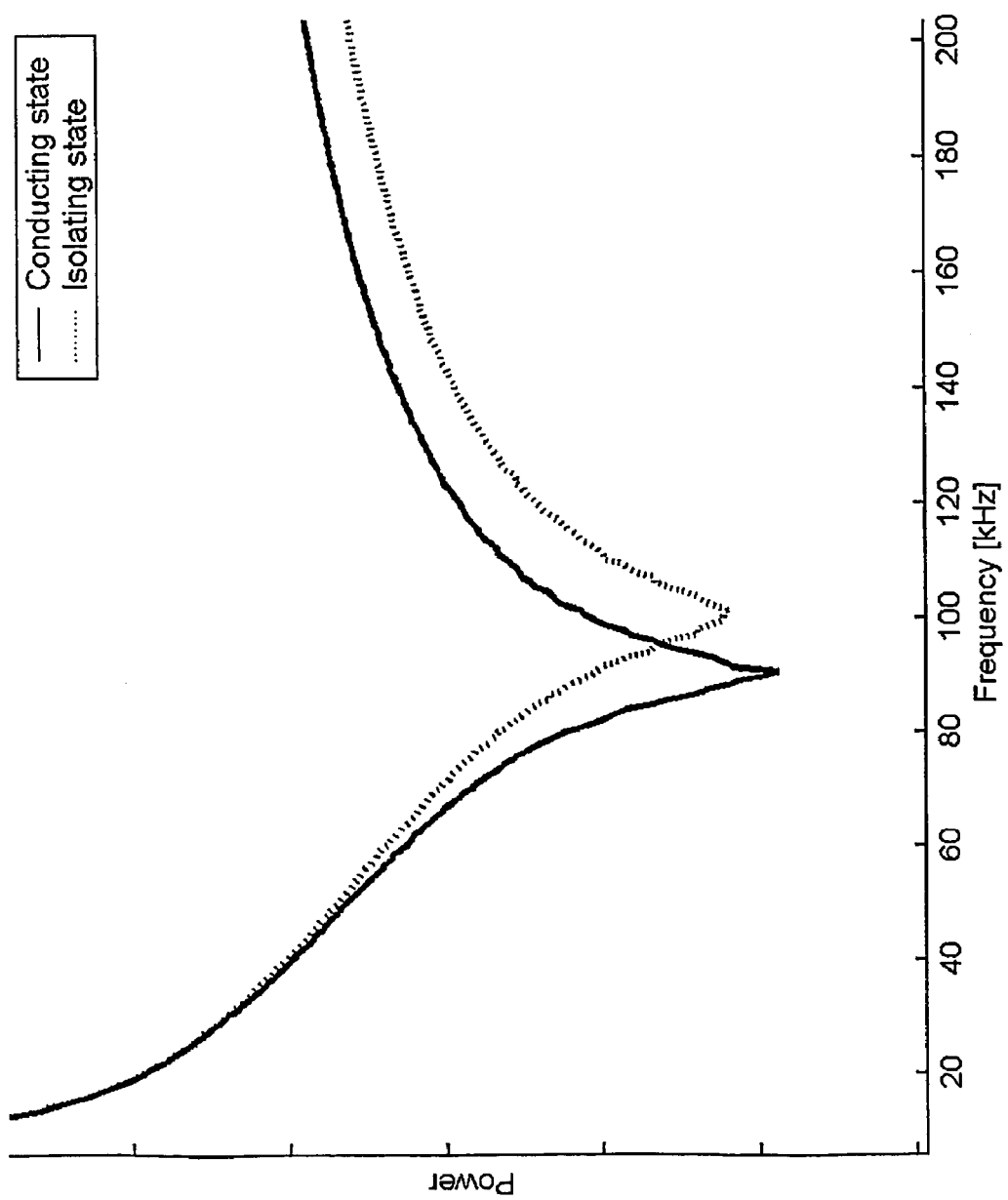
FIG. 8 shows the characteristic changes in reader signal when measuring on a device in connection with a bi-stable transistor as shown in FIG. 1.

In FIG. 8, response curves for different gate voltages are shown for a bi-stable transistor member. As shown in the figure, the frequency response is dependent on the applied gate voltage (0 V and 5 V, respectively). Hence, a change in the state of the transistor member of the inventive electrochemical device can be read remotely by means of this frequency shift in the response curve. In this way, an ID-code may be remotely read from the electrochemical device according to the invention by means of a read-out device that is capacitively coupled to the antenna member. As seen, the frequency response of the device is at a higher frequency when the transistor is in an isolating state, than in a conducting state.

Figure 9:
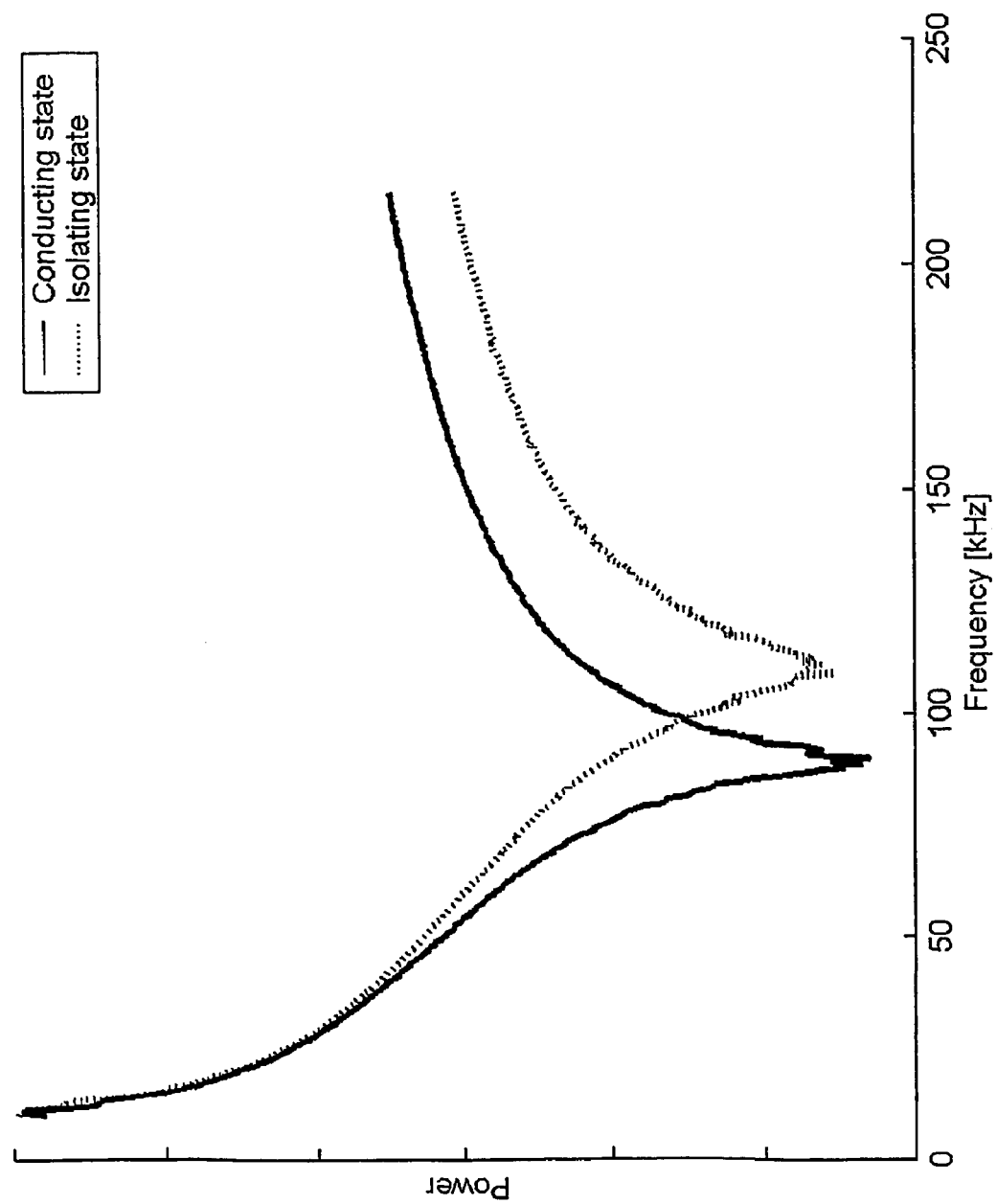
FIG. 9 shows the characteristic changes in reader signal when measuring on a device in connection with a dynamic transistor as shown in FIG. 2.

FIG. 9 shows a similar situation as FIG. 8, but in the case of a dynamic transistor member. Again, and as seen from the figure, the frequency response of the device is at a higher frequency when the transistor is in an isolating state, than in a conducting state.

It is also conceivable that the state of the transistor member is altered by environmental influence, thereby, in fact, making the device a remotely readable sensor. For example, the characteristics of the electrolyte may change according to temperature, humidity or some other influence, such that the frequency response is altered.

In conclusion, a transmitter device based on electrochemical transistors connected to an antenna member has been disclosed. A first pad of the antenna member is connected to the source of a transistor, and a second pad of the antenna member is connected to the drain of the transistor. The charge transport between the two pads is controlled by the transistor member of the inventive device.

The invention claimed is:

1. A supported or self-supporting electrochemical transmitter device comprising:
    a transistor member electrically connected to an antenna member arranged for transmitting a signal,
    wherein the transistor member has
        a source contact,
        a drain contact,
        at least one gate electrode,
        an electrochemically active element arranged between, and in direct electrical contact with, the source and drain contacts, which electrochemically active element comprises a transistor channel and is of a material comprising an organic material having the ability of electrochemically altering its conductivity through change of redox state thereof, and
        a solidified electrolyte in direct electrical contact with the electrochemically active element and said at least one gate electrode and interposed between them in such a way that electron flow between the electrochemically active element and said gate electrode(s) is prevented,
    flow of electrons between the source contact and the drain contact being controllable by means of a voltage applied to said gate electrode(s); and wherein
    the antenna member has a first antenna pad and a second antenna pad, the first antenna pad comprising a metal or electrically conductive organic or polymer material, and being in direct electrical contact with the source of the transistor member, the second antenna pad comprising a metal or electrically conductive organic or polymer material, and being in direct electrical contact with the drain contact of the transistor member wherein no wires contact the first antenna pad except those originating from the source contact of the transistor member, and no wires contact the second antenna pad except those originating from the drain contact of the transistor member.

2. An electrochemical transmitter device according to claim 1, in which said source and drain contacts, gate electrode(s) and electrochemically active element are arranged in one common plane.

3. An electrochemical transmitter device according to claim 2, in which a continuous or interrupted layer of said solidified electrolyte covers the electrochemically active element and covers at least partially said gate electrode(s).

4. An electrochemical transmitter device according to claim 1, in which at least one of said antenna pads, source and drain contacts and gate electrode(s) is formed from the same material as the electrochemically active element.

5. An electrochemical transmitter device according to claim 4, in which all of said antenna pads, source and drain contacts and gate electrode(s) are formed from the same material as the electrochemically active element.

6. An electrochemical device according to claim 5, in which the antenna pads, source and drain contacts and the electrochemically active element are formed from a continuous piece of said material comprising an organic material.

7. An electrochemical transmitter device according to claim 4, in which the antenna pads, source and drain contacts and the electrochemically active element are formed from a continuous piece of said material comprising an organic material.

8. An electrochemical transmitter device according to claim 1, in which said transistor channel retains its redox state upon removal of the gate voltage.

9. An electrochemical transmitter device according to claim 1, in which said transistor channel spontaneously returns to its initial redox state upon removal of the gate voltage.

10. An electrochemical transmitter device according to claim 9, in which the electrochemically active element further comprises a redox sink volume adjacent to the transistor channel, the device comprising at least two gate electrodes arranged on opposite sides of the electrochemically active element so that one gate electrode is closer to the transistor channel and one gate electrode is closer to the redox sink volume.

11. An electrochemical transmitter device according to claim 1, in which said organic material is a polymer.

12. An electrochemical transmitter device according to claim 11, in which said polymer material is selected from the group consisting of polythiophenes, polypyrroles, polyanilines, polyisothianaphtalenes, polyphenylene vinylenes and copolymers thereof.

13. An electrochemical transmitter device according to claim 12, in which said polymer material is a polymer or copolymer of a 3,4-dialkoxythiophene, in which said two alkoxy groups may be the same or different or together represent an optionally substituted oxy-alkylene-oxy bridge.

14. An electrochemical transmitter device according to claim 13, in which said polymer or copolymer of a 3,4-dialkoxythiophene is selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene), poly(3,4-butylenedioxythiophene) derivatives, and copolymers therewith.

15. An electrochemical transmitter device according to claim 1, in which said organic material further comprises a polyanion compound.

16. An electrochemical transmitter device according to claim 15, in which said polyanion compound is poly(styrene sulphonic acid) or a salt thereof.

17. An electrochemical transmitter device according to claim 1, in which said solidified electrolyte comprises a binder.

18. An electrochemical transmitter device according to claim 17, in which said binder is a gelling agent selected from the group consisting of gelatine, a gelatine derivative, polyacrylic acid, polymethacrylic acid, poly(vinylpyrrolidone), polysaccharides, polyacrylamides, polyurethanes, polypropylene oxides, polyethylene oxides, poly(styrene sulphonic acid) and poly(vinyl alcohol), and salts and copolymers thereof.

19. An electrochemical transmitter device according to claim 1, in which said solidified electrolyte comprises an ionic salt.

20. An electrochemical transmitter device according to claim 1, which is self-supporting.

21. An electrochemical transmitter device according to claim 1, which is arranged on a support.

22. An electrochemical transmitter device according to claim 21, in which said support is selected from the group consisting of polyethylene terephthalate, polyethylene naphthalene dicarboxylate, polyethylene, polypropylene, polycarbonate, paper, coated paper, resin-coated paper, paper laminates, paperboard, corrugated board and glass.

23. An electrochemical device according to claim 1, wherein said transmitted signal is an identification code.

24. An electrochemical device according to claim 1, wherein said transmitted signal is a radio frequency signal.

25. An electrochemical device according to claim 1, wherein said transmitted signal is remotely read by a read-out device.

26. A supported or self-supporting electrochemical device comprising:
  (i) an electrochemical transistor member having
    a source contact,
    a drain contact,
    at least one gate electrode,
    an electrochemically active element arranged between, and in direct electrical contact with, the source and drain contacts, which electrochemically active element comprises a transistor channel and is of a material comprising an organic material having the ability of electrochemically altering its conductivity through change of redox state thereof, and
    a solidified electrolyte in direct electrical contact with the electrochemically active element and said at least one gate electrode and interposed between them in such a way that electron flow between the electrochemically active element and said gate electrode(s) is prevented,
  whereby flow of electrons between source contact and drain contact is controllable by means of a voltage applied to said gate electrode(s); and
  (ii) an antenna member having an antenna pad, said antenna pad being in direct electrical contact with the source of said transistor member,
    said drain of said transistor member being electrically connected to ground wherein no wires contact the antenna pad except those originating from the source contact of the transistor member.

27. A process for manufacturing of an electrochemical device as defined in claim 1, wherein said antenna pad(s), contacts, electrode(s), electrochemically active element and/or electrolyte are deposited by means of printing techniques.

28. A process according to claim 27, wherein said antenna pad(s), contacts, electrode(s), electrochemically active element and electrolyte are deposited by means of coating techniques.

29. A process according to claim 28, in which device said organic material comprises a polymer, which process comprises deposition of said polymer on a support through in situ polymerisation.

30. A process according to claim 28, comprising patterning of any one of said contacts, electrode(s) and electrochemically active element using a subtractive method.

31. A process according to claim 27, in which device said organic material comprises a polymer, which process comprises deposition of said polymer on a support through in situ polymerisation.

32. A process according to claim 31, comprising patterning of any one of said contacts, electrode(s) and electrochemically active element using a subtractive method.

33. A process according to claim 27, comprising patterning of any one of said contacts, electrode(s) and electrochemically active element using a subtractive method.

34. A process according to claim 33, in which patterning is performed through chemical etching.

35. A process according to claim 33, in which said patterning is performed through gas etching.

36. A process according to claim 33, in which said patterning is performed by mechanical means, comprising scratching, scoring, scraping and milling.

37. A process according to claim 26, wherein said transmitted signal is an identification code.

38. A process according to claim 26, wherein said transmitted signal is a radio frequency signal.

39. A process according to claim 26, wherein said transmitted signal is remotely ready by a read-out device.

40. A supported or self-supporting electrochemical transmitter device comprising:
a transistor member electrically connected to an antenna member arranged for transmitting a signal,
wherein the transistor member has a source contact,
a drain contact,
at least one gate electrode,
an electrochemically active element arranged between, and in direct electrical contact with, the source and drain contacts, which electrochemically active element comprises a transistor channel and is of a material comprising an organic material having the ability of electrochemically altering its conductivity through change of redox state thereof, and a solidified electrolyte in direct electrical contact with the electrochemically active element and said at least one gate electrode and interposed between them in such a way that electron flow between the electrochemically active element and said gate electrode(s) is prevented,
flow of electrons between the source contact and the drain contact being controllable by means of a voltage applied to said gate electrode(s); and wherein
the antenna member has a first antenna pad and a second antenna pad, the first antenna pad comprising a metal or electrically conductive organic or polymer material, and being in direct electrical contact with the source contact of the transistor member, the second antenna pad comprising a metal or electrically conductive organic or polymer material, and being in direct electrical contact with the drain contact of the transistor member, wherein the first antenna pad is in direct electrical contact only with the source contact of the transistor member, and the second antenna pad is in direct electrical contact only with the drain contact of the transistor member.

41. A supported or self-supporting electrochemical device comprising:
an electrochemical transistor member having
a source contact,
a drain contact,
at least one gate electrode,
an electrochemically active element arranged between, and in direct electrical contact with, the source and drain contacts, which electrochemically active element comprises a transistor channel and is of a material comprising an organic material having the ability of electrochemically altering its conductivity through change of redox state thereof, and
a solidified electrolyte in direct electrical contact with the electrochemically active element and said at least one gate electrode and interposed between them in such a way that electron flow between the electrochemically active element and said gate electrode(s) is prevented,
wherein flow of electrons between source contact and drain contact is controllable by means of a voltage applied to said gate electrode(s); and
an antenna member for transmitting a signal, the antenna member having an antenna pad, said antenna pad being in direct electrical contact with the source contact of said transistor member,
said drain contact of said transistor member being electrically connected to ground,
wherein the antenna pad is in direct electrical contact only with the source contact of the transistor member.

* * * * *